US009997572B2

(12) United States Patent
Ushikubo (10) Patent No.: US 9,997,572 B2
(45) Date of Patent: Jun. 12, 2018

(54) DISPLAY DEVICE HAVING A LIGHT SCATTERING STRUCTURE

(71) Applicant: Japan Display Inc., Minato-ku (JP)

(72) Inventor: Takahiro Ushikubo, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/416,237

(22) Filed: Jan. 26, 2017

(65) Prior Publication Data
US 2017/0250233 A1 Aug. 31, 2017

(30) Foreign Application Priority Data
Feb. 26, 2016 (JP) .................................. 2016-036009

(51) Int. Cl.
*H01L 27/32* (2006.01)
*H01L 51/52* (2006.01)
*H01L 51/50* (2006.01)

(52) U.S. Cl.
CPC ...... *H01L 27/3213* (2013.01); *H01L 27/3211* (2013.01); *H01L 27/3246* (2013.01); *H01L 27/3276* (2013.01); *H01L 51/5016* (2013.01); *H01L 51/5268* (2013.01); *H01L 51/5271* (2013.01)

(58) Field of Classification Search
CPC .............. H01L 27/3213; H01L 51/5268; H01L 51/5271; H01L 51/5016; H01L 27/3246; H01L 27/3211; H01L 27/3276
See application file for complete search history.

(56) References Cited

U.S. PATENT DOCUMENTS

| 8,664,655 | B2 * | 3/2014 | Lee ...................... H01L 27/3213 257/45 |
| 2005/0225232 | A1 * | 10/2005 | Boroson ............ H01L 51/5265 313/504 |
| 2010/0052524 | A1 * | 3/2010 | Kinoshita ........... H01L 51/5265 313/504 |
| 2010/0060148 | A1 * | 3/2010 | Hwang ............... H01L 27/3213 313/504 |
| 2011/0198629 | A1 | 8/2011 | Lee et al. |
| 2014/0183480 | A1 * | 7/2014 | Lee ...................... H01L 51/5012 257/40 |
| 2016/0087247 | A1 * | 3/2016 | Kim .................... H01L 51/5284 257/40 |
| 2016/0126501 | A1 * | 5/2016 | Kim .................... H01L 51/5268 257/40 |
| 2016/0141555 | A1 * | 5/2016 | Song ................... H01L 51/5278 257/40 |

FOREIGN PATENT DOCUMENTS

JP 2011-22462 2/2011
JP 2011-165664 8/2011

* cited by examiner

*Primary Examiner* — Alonzo Chambliss
(74) *Attorney, Agent, or Firm* — Oblon, McClelland, Maier & Neustadt, L.L.P.

(57) ABSTRACT

The reflecting layer is formed on a white pixel PW and chromatic color pixels PR, PG, and PB. The semitransparent reflecting layer is formed on the white pixel PW and the chromatic color pixels PR, PG, and PB. The semitransparent reflecting layer and the intermediate layer in the white pixel PW constitute the light scattering structure. According to this display device, it is possible to obtain an advantage of a micro-cavity structure and an advantage of the white pixel while suppressing an increase in manufacturing cost.

13 Claims, 5 Drawing Sheets

DISPLAY DEVICE HAVING A LIGHT SCATTERING STRUCTURE

CROSS-REFERENCE TO RELATED APPLICATION

The present application claims priority from Japanese application JP2016-036009 filed on Feb. 26, 2016, the content of which is hereby incorporated by reference into this application.

BACKGROUND OF THE INVENTION

1. Field of the Invention

The present patent specification relates to a display device and more particularly to a display device including pixels that employs light-emitting elements such as organic electroluminescent (EL) elements.

2. Description of the Related Art

Some organic EL display devices have an optical micro-cavity structure where a distance between a reflecting layer and a semitransparent reflecting layer in pixels is regulated according to wavelength of light emitted from a light emitting layer. In most of the devices, the reflecting layer and the semitransparent reflecting layer are employed as electrodes, and the light emitting layer is formed between the reflecting layer and the semitransparent reflecting layer. The light emitted from the light emitting layer repeatedly reflects on and between the semitransparent reflecting layer and the reflecting layer. Consequently, light having wavelength that matches to the light path length (distance) between the semitransparent reflecting layer and the reflecting layer is intensified to pass through the semitransparent reflecting layer. Such a micro-cavity structure improves color purity of light and luminous efficiency.

Some organic EL display devices include a white pixel in addition to chromatic color pixels such as a red pixel, a green pixel, and a blue pixel. The white pixel contributes to improve the luminance of an image and reduce the power consumption.

As described above, the micro-cavity structure intensifies only light having a particular wavelength that matches to the light path length. Therefore, a white pixel having the micro-cavity structure would not emit pure white light. Accordingly, the micro-cavity structure is not good to the white pixel. In regard to this problem, the display device described in JP2011-165664A includes the micro-cavity structure in the chromatic color pixels and does not include the semi-transparent reflecting layer in the white pixel. That is, the micro-cavity structure is not formed in the white pixel. Such display device has both of the advantage obtained from the white pixel and the advantage obtained from the micro-cavity structure formed in the chromatic color pixels.

SUMMARY OF THE INVENTION

However, the structure described in JP2011-165664A requires, in manufacturing the device, to pattern the semi-transparent reflecting layer in accord with positions of the white pixels and the chromatic color pixels. The patterning process increases cost in manufacturing the device.

One of objects of the present disclosure is to provide a display device having both of an advantage obtained from a white pixel and an advantage obtained from a micro-cavity structure, while avoiding increase of cost in manufacturing.

An embodiment of the display device includes a white pixel that emits white light, a plurality of chromatic color pixels that emit light of chromatic colors, the chromatic color pixels including a chromatic color pixel that emits first color light and a chromatic color pixel that emits second color light, a first reflecting layer disposed on the white pixel and the chromatic color pixels, a second reflecting layer disposed on the white pixel and the chromatic color pixels, the second reflecting layer and the first reflecting layer facing each other, and a light emitting layer disposed on the white pixel and the chromatic color pixels and formed between the first reflecting layer and the second reflecting layer. The chromatic color pixel that emits the first color light is different from the chromatic color pixel that emits the second color light in distance between the first reflecting layer and the second reflecting layer. At least one of the second reflecting layer and a layer between the first reflecting layer and the second reflecting layer has a light scattering structure in the white pixel.

The above described display device includes the light scattering structure in the white pixel. Accordingly, the display device can reduce light reflecting on the second reflecting layer toward the first reflecting layer and thus make optical interference (that is, micro-cavity effect) hardly occur in the white pixel. Consequently, the display device can make color of light emitted from the white pixel pure to utilize an advantage of the white pixel. Further, in the above described display device, the chromatic color pixel that emits the first color light is different from the chromatic color pixel that emits the second color light in distance between the first reflecting layer and the second reflecting layer. Accordingly, the display device can include a micro-cavity structure and thus have an advantage obtained from the micro-cavity structure. Still further, in the above described display device, the second reflecting layer is formed on the white pixel and the chromatic color pixels. Accordingly, the display device does not require to pattern the semitransparent reflecting layer in accord with positions of the white pixel and the chromatic color pixels. Thus, the display device can avoid increase of cost in manufacturing.

DETAILED DESCRIPTION OF THE INVENTION

Hereinafter, embodiments according to the present invention will be described. In the present specification, an organic EL display device including an organic LED (Light Emitting Diode) as a light emitting element will be described as an example of the embodiments. The present invention may be applied to a display device including a quantum dot LED as the light emitting element.

Figure 1:
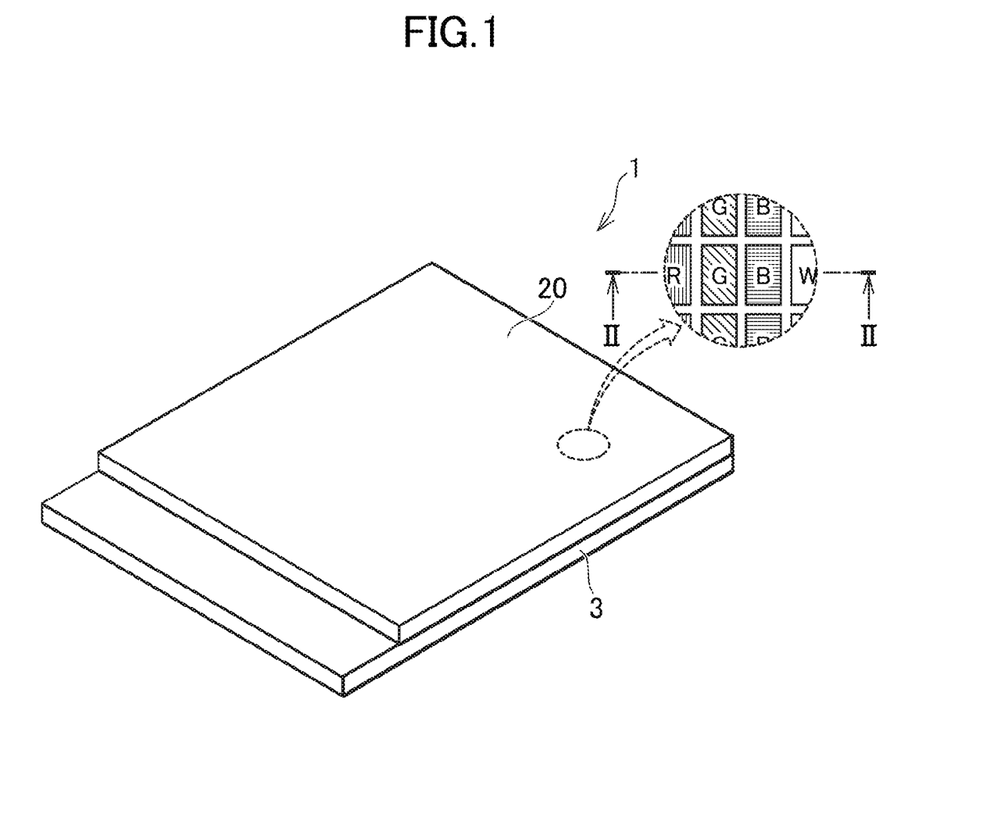
FIG. 1 illustrates an exemplary organic EL display device of embodiments according to the present invention.
Figure 2:
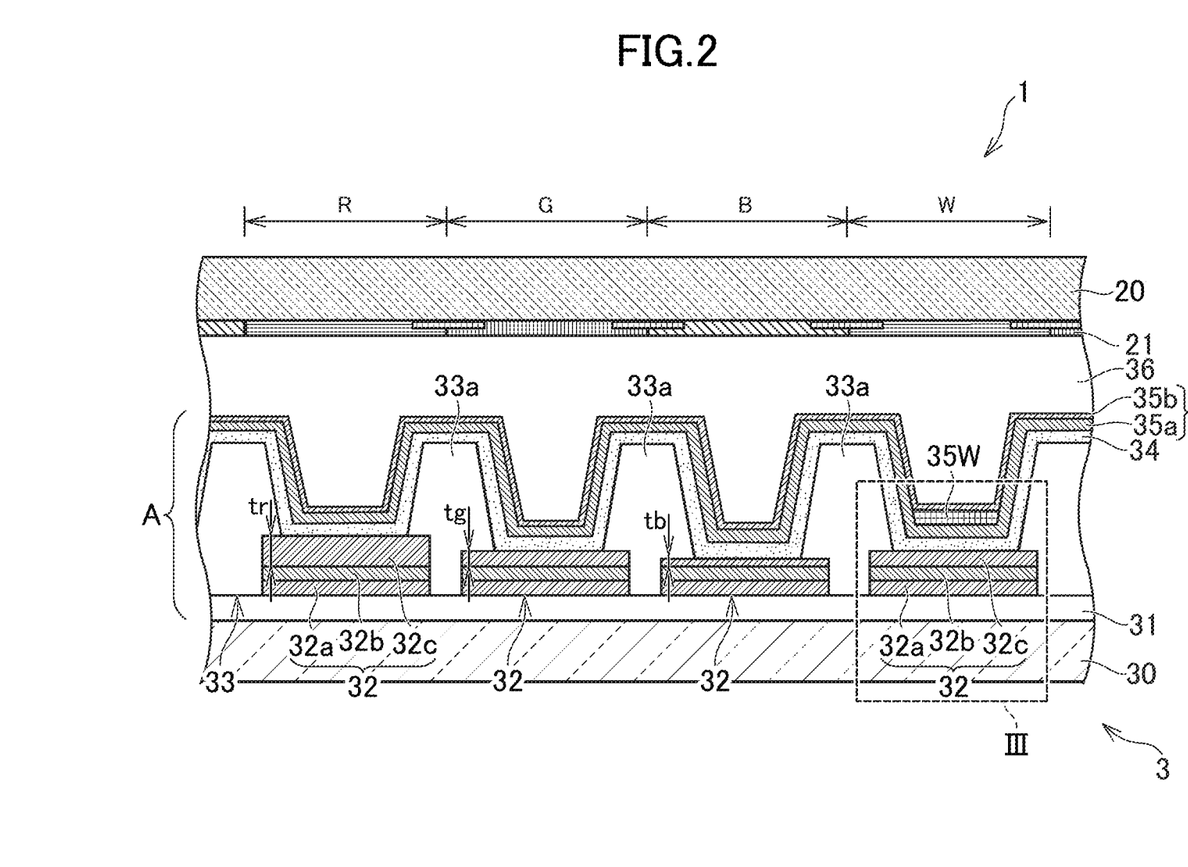
FIG. 2 is a cross section taken along line II-II in FIG. 1.

FIG. 1 illustrates an exemplary organic EL display device of embodiments according to the present invention. FIG. 2 is a cross section taken along line II-II in FIG. 1. In the following description, an "upward direction" means a direction from a display panel 3 to an opposite substrate 20. On the contrary, a "downward direction" means a direction from the opposite substrate 20 to the display panel 3.

The present specification discloses examples of various embodiments according to the present invention. Embodiments which maintain the spirit of the present invention and are easily modified by those skilled in the art are surely contained in the scope of the invention. In addition, a width, a thickness, and a shape of each portion shown in the drawings are merely an example. The width, the thickness, and the shape shown in the drawings do not limit the interpretation of the invention.

Unless otherwise defined, an expression in the present specification that "an element A is disposed, or formed, on an element B" covers, in interpretation thereof, both of an embodiment in which "an element A is disposed immediately above, and in contact with, an element B" and an embodiment "an element A is disposed above an element B via another element formed between the element A and the element B" (the word "element" described here covers "member", "portion" "layer" or the like). For example, an expression "a circuit layer 31 formed on a substrate 30" should be interpreted to include "a circuit layer 31 formed above, and in contact with, a substrate 30" and "a circuit layer 31 formed above a substrate 30 via one or more layers formed between the circuit layer 31 and the substrate 30".

As shown in FIGS. 1 and 2, the organic EL display device includes white pixels PW that emit white light and a plurality of chromatic color pixels that respectively emit light of chromatic colors different from each other. In the example of display device 1, a red pixel PR, a green pixel PG, and a blue pixel PB are formed as the chromatic color pixels. The colors of chromatic color pixels are not limited to the example described here. In the examples of FIGS. 1 and 2, the white pixels and the chromatic color pixels are arranged in the horizontal direction, but the arrangement of the pixels is not limited to the example shown in these figures.

As shown in FIG. 2, the display device 1 includes a display panel 3. The substrate 30 of the display panel 3 has a laminated structure A formed thereon. The substrate 30 may be a glass substrate or a resin substrate such as an acrylic substrate. The laminated structure A includes a circuit layer 31 formed on the substrate 30. The circuit layer 31 has a circuit formed therein for controlling light emission of each pixel. An example of the circuit formed in the circuit layer 31 will be described later.

As shown in FIG. 2, the laminated structure A includes a pixel electrode 32 formed in each of the plurality of pixels. In the example of display device 1, the pixel electrode 32 includes a transparent conductive layer 32a, a reflecting layer 32b formed on the transparent conductive layer 32a, and a transparent conductive layer 32c formed on the reflecting layer 32b ("reflecting layer 32b" corresponds to a "first reflecting layer" in the claims). The transparent conductive layers 32a and 32c are formed of a transparent conductive material such as ITO (Indium Tin Oxide) or IZO (Indium Zinc Oxide), for example. The reflecting layer 32b is formed of metal such as Ag, for example. The reflecting layer 32b is lower in light permeability than the semitransparent reflecting layer described later, in other words, an opaque reflecting layer. The pixel electrode 32 does not necessarily include the transparent conductive layer 31a.

As shown in FIG. 2, a bank layer 33 is formed on the pixel electrode 32. The bank layer 33 includes banks 33a each of which partitions two adjacent pixels. The bank 33a overlaps the outer peripheral portion of each pixel electrode 32. The pixel electrode 32 is exposed in an opening formed inside the bank 33a.

As shown in FIG. 2, an organic layer 34 is formed so as to cover the bank 33a and the pixel electrode 32. The organic layer 34 includes light emitting layers. In addition, the organic layer 34 may include an electric charge injection layer (for example, a hole injection layer, an electron injection layer) and an electric charge transport layer (for example, a hole transport layer, an electron transport layer). In the example of display device 1, the light emitting layer of the organic layer 34 is formed in a common structure over the entire display area of the display panel 3, and is configured to emit white light. That is, the light emitting layer of the organic layer 34 has the same structure in all pixels of the display area. For example, a light emitting layer that emits red light, a light emitting layer that emits green light, and a light emitting layer that emits blue light may be stacked in each pixel to form the light emitting layer of the organic layer 34. In another example, the light emitting layer of the organic layer 34 may be configured in each pixel to emit light of the color of the pixel. For example, the light emitting layer may be configured in the red pixel PR to emit red light, the light emitting layer may be configured in the green pixel PG to emit green light, and the light emitting layer may be configured in the blue pixel PB to emit blue light. In this case, the other layers of the organic layer 34 (that is, the electric charge injection layer and the electric charge transport layer) may be formed in common structure over the entire display area.

As shown in FIG. 2, a common electrode 35 is formed on the organic layer 34. The common electrode 35 includes a transparent conductive layer 35a and a semitransparent reflecting layer 35b (the semitransparent reflecting layer 35b corresponds to the "second reflecting layer" of the claims). The common electrode 35 has a common structure over the plurality of pixels. That is, each of the transparent conductive layer 35a and the semitransparent reflecting layer 35b is formed continuously over the plurality of pixels (for example, all pixels of the display area). The transparent conductive layer 35a is formed of a transparent conductive material such as ITO or IZO, for example. A portion of light incident on the semitransparent reflecting layer 35b passes through the semitransparent reflecting layer 35b, and the rest of the light reflects on the semitransparent reflecting layer 35b. The material of the semitransparent reflecting layer 35b is, for example, an alloy of Mg and Ag. The common electrode 35 may be covered with a barrier layer to prevent moisture from penetrating into the organic layer 34.

As shown in FIG. 2, the white pixel PW includes an intermediate layer 35W which will be described later in detail between the semitransparent reflecting layer 35b and the transparent conductive layer 35a. The chromatic color pixels (pixels PR, PG, PB in the example of display device 1) do not have the intermediate layer 35W. Therefore, in chromatic color pixels, the semitransparent reflecting layer 35b is in contact with the transparent conductive layer 35a. The semitransparent reflecting layer 35b is preferably formed of a material having conductivity. Such a semitransparent reflecting layer 35b contributes to lower the electric resistance of the common electrode 35.

As shown in FIG. 2, the display device 1 includes an opposite substrate 20 facing the display panel 3. In the example of display device 1, color filters 21 are formed on the opposite substrate 20. The position and the color of the color filter 21 correspond to the position and the color of pixel, respectively. The color filter 21 may not be formed in the white pixel PW. Alternatively, the white pixel PW may have a color filter that is not colored. For the display device in which the light emitting layer of the organic layer 34 is formed in respective pixels so as to emit light of the color of the pixel, the color filter 21 may not be formed on the opposite substrate 20. A filler material 36 is disposed between the display panel 3 and the opposite substrate 20.

As described above, each of the plurality of chromatic color pixels includes the reflecting layer 32b constituting the pixel electrode 32. Also, these pixels include the semitransparent reflecting layer 35b facing the reflecting layer 32b. The light emitting layer of the organic layer 34 is formed between the reflecting layer 32b and the semitransparent reflecting layer 35b in each pixel. Therefore, the light emitted from the light emitting layer reflects repeatedly on the reflecting layer 32b and on the semitransparent reflecting layer 35b. The light passes through the semitransparent reflecting layer 35b and then passes through the color filter 21 to exit to the outside.

The semitransparent reflecting layer 35b and the reflecting layer 32b form an optical micro-cavity structure in the chromatic color pixels. That is, the distance between the semitransparent reflecting layer 35b and the reflecting layer 32b is regulated according to the wavelength of the light of the color of each chromatic color pixel. As a result, the light emitted from the light emitting layer of the organic layer 34 is repeatedly reflected on the semitransparent reflecting layer 35b and on the reflecting layer 32b to cause optical interference. Therefore, the chromatic color pixel that emits first color light and the chromatic color pixel that emits second color light are different from each other in distance between the semitransparent reflecting layer 35b and the reflecting layer 32b. In the example of display device 1, the red pixel PR, the green pixel PG, and the blue pixel PB are different from each other in distance between the semitransparent reflecting layer 35b and the reflecting layer 32b. In the example of display device 1, as shown in FIG. 2, the thickness of the transparent conductive layer 32c of the pixel electrode 32 is regulated according to the wavelength of light of the color of each chromatic color pixel. The thickness tr of the transparent conductive layer 32c of the red pixel PR, the thickness tg of the transparent conductive layer 32c of the green pixel PG, and the thickness tb of the transparent conductive layer 32c of the blue pixel PB are regulated according to the color of each pixel, and have a relation of tr>tg>tb.

As shown in FIG. 2, the semitransparent reflecting layer 35b is also formed in the white pixels PW. The semitransparent reflecting layer 35b is continuously formed over the white pixels PW and the chromatic color pixels. Therefore, it is unnecessary to pattern the semitransparent reflecting layer 35b according to the positions of the pixels, and thus it is unnecessary in manufacturing process to use a fine mask for forming the semitransparent reflecting layer 35b. As a result, increase in the manufacturing cost of the display device 1 can be suppressed.

In the white pixel PW, at least one of the semitransparent reflecting layer 35b and a layer between the semitransparent reflecting layer 35b and the reflecting layer 32b forms a light scattering structure. The light scattering structure scatters the light incident on the light scattering structure and/or the light hitting the light scattering structure. In white pixel PW, the light scattering structure can suppress the micro-cavity effect that intensifies only a specific color component and thus prevent that the color of the light emitted from the white pixel PW is deviated from pure white.

As described above, the white pixel PW includes the intermediate layer 35W formed between the transparent conductive layer 35a and the semitransparent reflecting layer 35b of the common electrode 35. As shown in FIG. 2, the intermediate layer 35W is disposed inside the bank 33a formed on the outer periphery of the white pixel PW. The intermediate layer 35W constitutes the structure for scattering the light emitted from the light emitting layer of the organic layer 34. The intermediate layer 35W can suppress the micro-cavity effect in the white pixel PW.

Figure 3:
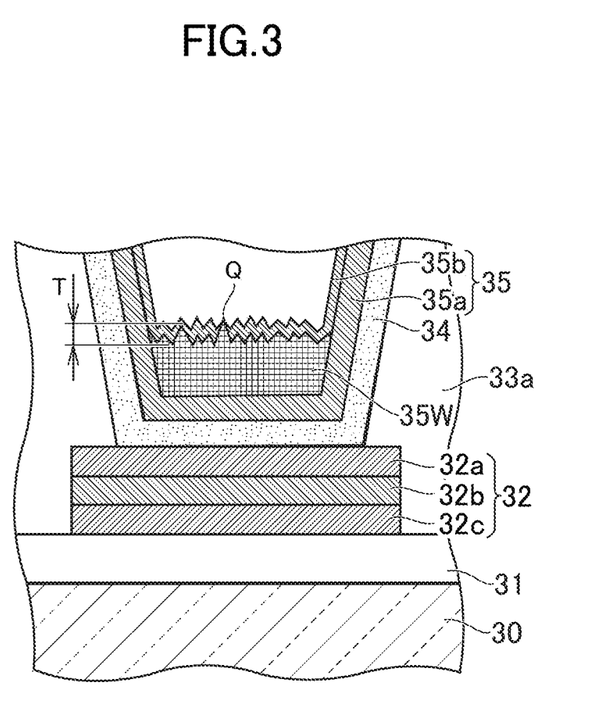
FIG. 3 is an enlarged view of a region indicated by a circle III in FIG. 2.

FIG. 3 is an enlarged view of a region indicated by a circle III in FIG. 2. As shown in FIG. 3, the semitransparent reflecting layer 35b is formed on the surface of the intermediate layer 35W. The surface of the intermediate layer 35W has roughness (recesses and protrusions). The semitransparent reflecting layer 35b has roughness that follows the roughness of the intermediate layer 35W. Therefore, the light emitted from the light emitting layer of the organic layer 34 to hit on the semitransparent reflecting layer 35b causes diffuse reflection to scatter. That is, in the white pixel PW, the semitransparent reflecting layer 35b and the intermediate layer 35W constitute the light scattering structure. The diffuse reflection reduces the light traveling from the semitransparent reflecting layer 35b to the reflecting layer 32b. This can suppress the micro-cavity effect in white pixel PW.

In the chromatic color pixels, the semitransparent reflecting layer 35b is formed on the surface of the transparent conductive layer 35a. In white pixel PW, the semitransparent reflecting layer 35b is formed on the surface of the intermediate layer 35W. The roughness of the surface of the intermediate layer 35W is greater than the roughness of the surface of the transparent conductive layer 35a. This structure can cause the micro-cavity effect due to the light reflection on the semitransparent reflecting layer 35b in the chromatic color pixels, and can cause diffuse reflection on the semitransparent reflecting layer 35b in the white pixel PW to suppress the micro-cavity effect.

The material of the intermediate layer 35W is, for example, an organic material. The intermediate layer 35W can be formed by, for example, an inkjet method. The inkjet method enables the organic material of the intermediate layer 35W to be formed only in the white pixel PW while suppressing an increase in the manufacturing cost of the display device 1. The intermediate layer 35W is formed by, for example, annealing the organic material. The annealing process makes a more preferable rough surface of the intermediate layer 35W. That is, the annealing process increases the roughness of the rough surface of the intermediate layer 35W. In the case of using the annealing treatment, the glass transition temperature of the material of the intermediate layer 35W is preferably lower than the glass transition temperature of the organic layer 34 formed between the pixel electrode 32 and the common electrode 35. This prevents degradation of the organic layer 34 in the annealing process for the intermediate layer 35W.

The material of the intermediate layer 35W is, for example, a crystalline polymer such as polyethylene, polypropylene or the like. Further, the material of the intermediate layer 35W may be an amorphous organic material. Examples of amorphous organic materials are mCP (N, N'-dicarbazole-3,5-benzene), CBP (4,4'-Bis (carbazol-9-yl) biphenyl), BCP (2,9-Dimethyl-4,7-diphenyl-1,10-phenanthroline) or Bphen ((4,7-Diphenyl-1,10-phenanthroline).

In the example of display device 1, the height T of the roughness of the intermediate layer 35W is larger than the thickness of the semitransparent reflecting layer 35b (the height T is the distance from the bottom of a recess to the top of a protrusion). This forms roughness that follows the roughness formed in the intermediate layer 35W on the upper surface of the semitransparent reflecting layer 35b and on the lower surface of the semitransparent reflecting layer 35b. The roughness of the lower surface and the roughness of the upper surface reduces the light that reflects on the semitransparent reflecting layer 35b toward the reflecting layer 32b. The thickness of the semitransparent reflecting layer 35b is several tens of nanometers. The height T of the roughness of the intermediate layer 35W is 0.5 micrometer (μm) or more. The height T of the roughness of the intermediate layer 35W is preferably 1 μm or more. The height T of the roughness of the intermediate layer 35W is more preferably 2 μm to 3 μm.

In the structure in which the thickness of the semitransparent reflecting layer 35b is smaller than the height T of the roughness of the intermediate layer 35W, the semitransparent reflecting layer 35b may have a portion that does not follow the roughness of the intermediate layer 35W. That is, as shown in FIG. 3, the semitransparent reflecting layer 35b may be interrupted at the top Q of the protrusion formed on the surface of the intermediate layer 35W. In this case, the light emitted from the light emitting layer of the organic layer 34 is transmitted through the interrupted portion (slit) of the semitransparent reflecting layer 35b. This can increase the light transmission of the semitransparent reflecting layer 35b.

In place of the example shown in FIG. 3, the thickness of the semitransparent reflecting layer 35b may be larger than the height T of the roughness formed in the intermediate layer 35W. In this case, the lower surface of the semitransparent reflecting layer 35b has roughness that follows the roughness of the intermediate layer 35W, while the upper surface of the semitransparent reflecting layer 35b may be flatter than its lower surface.

Figure 4:
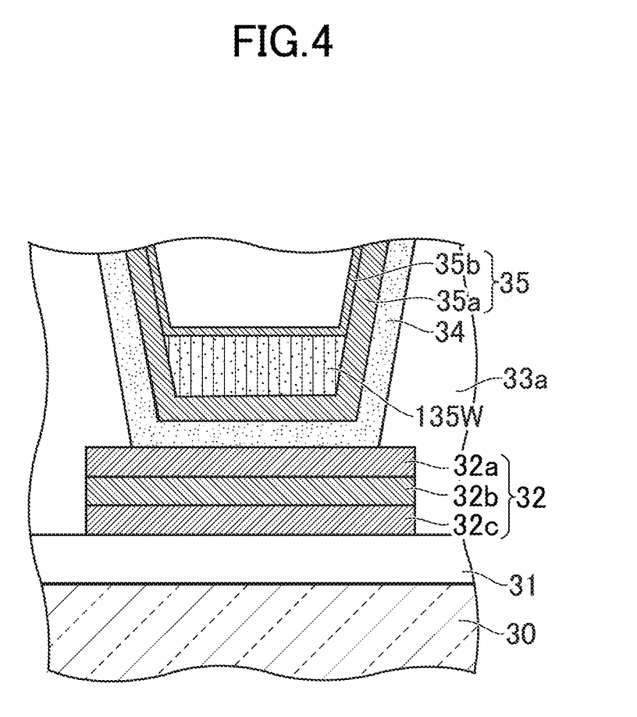
FIG. 4 is a cross sectional view showing a modified example of the intermediate layer illustrated in FIG. 3.

The light scattering structure that scatters the light emitted from the light emitting layer of the organic layer 34 is not limited to the rough surface of the intermediate layer 35W as shown in FIG. 3. FIG. 4 is a view showing a modified example of the intermediate layer 35W. In FIG. 4, the intermediate layer 135W is shown as an alternative example of the intermediate layer 35W. In FIG. 4, the same reference numerals are given to the same portions as those described above. Structures and materials not described about the example shown in FIG. 4 are the same as those described in FIGS. 2 and 3.

Similarly to the intermediate layer 35W, the intermediate layer 135W is formed on the transparent conductive layer 35a and covered with the semitransparent reflecting layer 35b. Further, the intermediate layer 135W is formed only in the white pixel PW, and is not formed in the chromatic color pixels. The intermediate layer 135W includes a base material formed of a resin and the like, and particles added to the base material. The particles are formed of a material having a refractive index different from that of the base material. In the example of display device 1, the refractive index of the material of the particles is lower than the refractive index of the base material. In this structure, light emitted from the light emitting layer of the organic layer 34 bends its traveling direction when hitting the particle. That is, the light emitted from the light emitting layer of the organic layer 34 scatters on the intermediate layer 135W. Therefore, the intermediate layer 135W can reduce the light reflected on the semitransparent reflecting layer 35b toward the reflecting layer 32b to suppress the micro-cavity effect in the white pixel PW.

The base material of the intermediate layer 135W is a resin such as acrylic resin, polyimide resin, epoxy resin, for example. The base material of the intermediate layer 135W is preferably a material with high transparency so that a sufficient transmittance can be obtained even if the intermediate layer 135W has a large thickness. The material of the particles added to the base material of the intermediate layer 135W has a refractive index lower than that of a resin which is the base material. The material of the particles is LiF or Ag, for example. The base material and the material of the particles are not limited to the examples described here. For example, the refractive index of the material of the particles may be higher than the refractive index of the base material.

The intermediate layer 135W can also be formed by an inkjet method, for example. That is, the intermediate layer 135W may be formed by an inkjet method in which a liquefied base material containing the particles is supplied to the white pixel PW.

Figure 5:
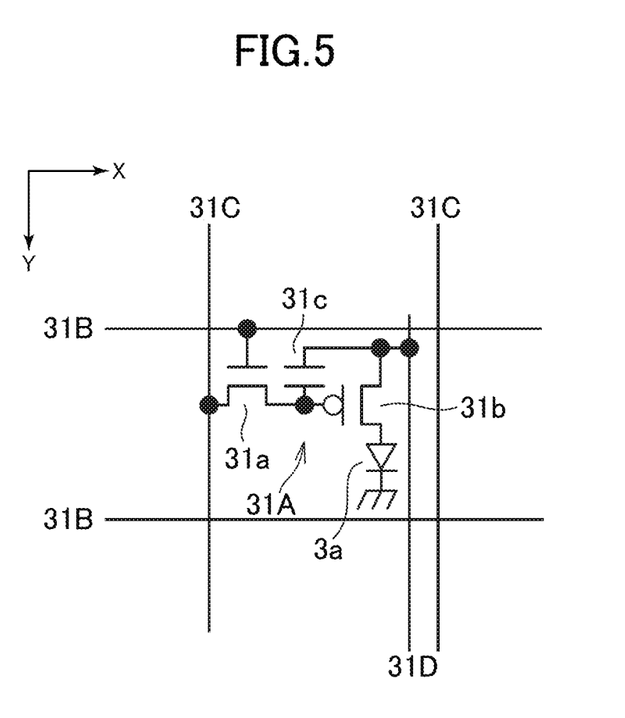
FIG. 5 illustrates an exemplary circuit formed in a circuit layer on a display panel.

FIG. 5 is a diagram showing an example of a circuit formed in the circuit layer 31. As shown in FIG. 5, the circuit layer 31 includes a pixel circuit 31A formed in each pixel. The pixel circuit 31A includes a plurality of Thin Film Transistors (TFTs) 31a and 31b, and a capacitor 31c. Further, scanning signal lines 31B each extending in the X direction, video signal lines 31C each extending in the Y direction, and driving power supply lines 31D each extending in the Y direction are formed in the circuit layer 31. The pixels are arranged in lines each extending in the X direction and in columns each extending in the Y direction. The plurality of lines are arranged in the Y direction, and the plurality of columns are arranged in the X direction. The scanning signal line 31B is provided for each line of pixels. The video signal line 31C is provided for each column of pixels. The scanning signal lines 31B are sequentially selected by a scanning line driving circuit (not shown). A voltage for turning on the switching TFT 31a is applied to the selected scanning signal line 31B. A voltage corresponding to the video signal for the pixel connected to the selected scanning signal line 31B is applied to the video signal line 31C. This voltage is applied to the capacitor 31c through the switching TFT 31a. The driving TFT 31b supplies a current corresponding to the voltage applied to the capacitor 31c to the OLED 3a. As a result, the OLED 3a of the pixel corresponding to the selected scanning signal line 31B emits light. The OLED 3a includes the pixel electrode 32, the organic layer 34, and the common electrode 35 described above. A current is supplied to the OLED 3a through the driving TFT 31b from the driving power supply line 31D. The anode of the OLED 3a (that is, pixel electrode 32 in the example of display device 1) is connected to the driving TFT 31b. On the other hand, the cathode of the OLED 3a (that is, common electrode 35 in the example of display device 1) is connected to the ground potential.

The present invention is not limited to the above-described embodiments, and various modifications are possible.

For example, the particles having low refractive index may be added to the intermediate layer 35W shown in the example of FIG. 3.

For example, the embodiments described above is a top emission type display device. However, the present invention may be applied to a bottom emission type display device. In this type, a semitransparent reflecting layer may be provided in the pixel electrode 32, and a reflecting layer (an opaque reflecting layer) may be provided in the common electrode 35. Even in this case, the intermediate layer 35W of the white pixel PW is provided in the common electrode.

That is, the intermediate layer 35W of the white pixel PW is formed between the reflecting layer and the transparent conductive layer of the common electrode.

In another modified example, the reflecting layer 32b and the semitransparent reflecting layer 35b do not necessarily form the electrode. For example, an insulating layer may be formed above the transparent conductive layer 35a forming the common electrode 35, and the semitransparent reflecting layer 35b may be formed above the insulating layer. In another example, the insulating layer may be formed above the reflecting layer 32b and a transparent conductive layer 32c forming the pixel electrode 32 may be formed above the insulating layer.

The present invention may be applied to a display device different from the organic EL display device. For example, the present invention may be applied to a display device including a light emitting layer formed of a quantum dot material instead of the light emitting layer of the organic layer 34.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a white pixel that emits white light;
a plurality of chromatic color pixels that emit light of chromatic colors, the chromatic color pixels including a chromatic color pixel that emits first color light and a chromatic color pixel that emits second color light;
a first reflecting layer disposed on the white pixel and the chromatic color pixels;
a second reflecting layer disposed on the white pixel and the chromatic color pixels, the second reflecting layer and the first reflecting layer facing each other; and
a light emitting layer disposed on the white pixel and the chromatic color pixels and formed between the first reflecting layer and the second reflecting layer,
wherein
the chromatic color pixel that emits the first color light is different from the chromatic color pixel that emits the second color light in distance between the first reflecting layer and the second reflecting layer,
the white pixel includes an intermediate layer including a rough surface,
the second reflecting layer in the white pixel is formed on the rough surface of the intermediate layer to constitute a light scattering structure, and
the rough surface of the intermediate layer has roughness that is higher than the thickness of the second reflecting layer.

2. The display device according to claim 1, wherein the rough surface of the intermediate layer in the white pixel is greater in roughness than a surface on which the second reflecting layer in the chromatic color pixels formed.

3. The display device according to claim 1, wherein the rough surface of the intermediate layer has height of roughness of 0.5 μm or more.

4. The display device according to claim 1, wherein the second reflecting layer is a semitransparent reflecting layer,
the intermediate layer is formed between the second reflecting layer and a transparent conductive layer forming an electrode, and
the intermediate layer forms the light scattering structure.

5. A display device comprising:
a white pixel that emits white light;
a plurality of chromatic color pixels that emit light of chromatic colors, the chromatic color pixels including a chromatic color pixel that emits first color light and a chromatic color pixel that emits second color light;
a first reflecting layer disposed on the white pixel and the chromatic color pixels;
a second reflecting layer disposed on the white pixel and the chromatic color pixels, the second reflecting layer and the first reflecting layer facing each other; and
a light emitting layer disposed on the white pixel and the chromatic color pixels and formed between the first reflecting layer and the second reflecting layer, wherein
the chromatic color pixel that emits the first color light is different from the chromatic color pixel that emits the second color light in distance between the first reflecting layer and the second reflecting layer,
the white pixel includes an intermediate layer including a rough surface,
the second reflecting layer in the white pixel is formed on the rough surface of the intermediate layer to constitute a light scattering structure,
each of the white pixel and the chromatic color pixels includes an organic layer, the organic layer including the light emitting layer and formed between two electrodes facing each other, and
a material of the intermediate layer has glass transition temperature that is lower than that of a material of the organic layer.

6. The display device according to claim 5, wherein the rough surface of the intermediate layer in the white pixel is greater in roughness than a surface on which the second reflecting layer in the chromatic color pixels formed.

7. The display device according to claim 5, wherein the rough surface of the intermediate layer has height of roughness of 0.5 μm or more.

8. The display device according to claim 5, wherein the second reflecting layer is a semitransparent reflecting layer,
the intermediate layer is formed between the second reflecting layer and a transparent conductive layer forming an electrode, and
the intermediate layer forms the light scattering structure.

9. A display device comprising:
a white pixel that emits white light;
a plurality of chromatic color pixels that emit light of chromatic colors, the chromatic color pixels including a chromatic color pixel that emits first color light and a chromatic color pixel that emits second color light;
a first reflecting layer disposed on the white pixel and the chromatic color pixels;
a second reflecting layer disposed on the white pixel and the chromatic color pixels, the second reflecting layer and the first reflecting layer facing each other; and
a light emitting layer disposed on the white pixel and the chromatic color pixels and formed between the first reflecting layer and the second reflecting layer,
wherein
the chromatic color pixel that emits the first color light is different from the chromatic color pixel that emits the second color light in distance between the first reflecting layer and the second reflecting layer, at least the white pixel of the white pixel and the chromatic color pixels includes an intermediate layer formed between the first reflecting layer and the second reflecting layer, and the intermediate layer in the white pixel contains particles formed of a material different in refractive index from a material of the intermediate layer to constitute a light scattering structure.

10. The display device according to claim 9, wherein the refractive index of the particles is lower than that of the material of the intermediate layer.

11. The display device according to claim 9, wherein the intermediate layer includes a rough surface, and the rough surface of the intermediate layer in the white pixel is greater in roughness than a surface on which the second reflecting layer in the chromatic color pixels formed.

12. The display device according to claim 9, wherein the intermediate layer includes a rough surface, and the rough surface of the intermediate layer has height of roughness of 0.5 µm or more.

13. The display device according to claim 9, wherein the second reflecting layer is a semitransparent reflecting layer, the intermediate layer is formed between the second reflecting layer and a transparent conductive layer forming an electrode, and the intermediate layer forms the light scattering structure.

* * * * *